(12) United States Patent
Kang (10) Patent No.: US 10,305,398 B2
(45) Date of Patent: May 28, 2019

(54) AUXILIARY GENERATOR FOR VEHICLE THAT GENERATES ELECTRIC POWER USING INERTIAL FORCE

(71) Applicant: LG CHEM, LTD., Seoul (KR)

(72) Inventor: Hyeong Kwan Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 286 days.

(21) Appl. No.: 15/323,296

(22) PCT Filed: Jul. 3, 2015

(86) PCT No.: PCT/KR2015/006848
§ 371 (c)(1),
(2) Date: Dec. 30, 2016

(87) PCT Pub. No.: WO2016/035989
PCT Pub. Date: Mar. 10, 2016

(65) Prior Publication Data
US 2017/0170750 A1   Jun. 15, 2017

(30) Foreign Application Priority Data

Sep. 4, 2014 (KR) .................. 10-2014-0117448

(51) Int. Cl.
*H01L 41/113* (2006.01)
*H02N 2/18* (2006.01)
(Continued)

(52) U.S. Cl.
CPC .............. *H02N 2/18* (2013.01); *B60L 50/30* (2019.02); *B60W 20/00* (2013.01);
(Continued)

(58) Field of Classification Search
CPC .............. H01L 41/113; H01L 41/1132; H01L 41/1134; H01L 41/1136; H01L 41/1138
(Continued)

(56) References Cited

U.S. PATENT DOCUMENTS 5,801,475 A * 9/1998 Kimura .................. G01P 13/00
                                                    310/319
2006/0087200 A1* 4/2006 Sakai ..................... H02N 2/183
                                                    310/339
(Continued)

FOREIGN PATENT DOCUMENTS

CN          85104971 A      2/1987
CN         103953511 A      7/2014
(Continued)

OTHER PUBLICATIONS

European Search Report for Appl. No. 15838248.1 dated Jul. 26, 2017.
(Continued)

*Primary Examiner* — Derek J Rosenau
(74) *Attorney, Agent, or Firm* — Birch, Stewart, Kolasch & Birch, LLP (57) ABSTRACT

Disclosed herein is an auxiliary generator for a vehicle that converts kinetic energy of the vehicle into electrical energy, the auxiliary generator including a spherical inertial body configured to be movable in a direction opposite to a direction in which the vehicle moves due to inertial force obtained from movement of the vehicle, a fixed pipe having the movable spherical inertial body received therein, a generation member mounted in the fixed pipe for generating electrical energy from movement of the spherical inertial body, and a converter electrically connected to the generation member for converting the electrical energy generated by the generation member into available electricity.

19 Claims, 4 Drawing Sheets

(51) Int. Cl.
    *B60W 20/00*    (2016.01)
    *H02N 1/04*     (2006.01)
    *H02J 7/32*     (2006.01)
    *H02J 7/14*     (2006.01)
    *B60L 50/30*    (2019.01)

(52) U.S. Cl.
    CPC .......... *H01L 41/113* (2013.01); *H02J 7/1423* (2013.01); *H02J 7/32* (2013.01); *H02N 1/04* (2013.01); *Y02T 10/7027* (2013.01)

(58) Field of Classification Search
    USPC .......................................................... 310/339
    See application file for complete search history.

(56) References Cited

U.S. PATENT DOCUMENTS

| | | | | |
|---|---|---|---|---|
| 2007/0278902 | A1* | 12/2007 | Rastegar | ............. F21L 13/00 310/339 |
| 2014/0217855 | A1 | 8/2014 | Shibamoto | |

FOREIGN PATENT DOCUMENTS

| | | |
|---|---|---|
| CN | 205070842 U | 3/2016 |
| EP | 1 322 030 A1 | 6/2003 |
| GB | 2484324 A | 4/2012 |
| JP | 2001-320887 A | 11/2001 |
| JP | 2003-61368 A | 2/2003 |
| JP | 2003-209980 A | 7/2003 |
| JP | 2004-187429 A | 7/2004 |
| JP | 2009-240011 A | 10/2009 |
| JP | 2010-35368 A | 2/2010 |
| JP | 2010-196669 A | 9/2010 |
| JP | 2011-69402 A | 4/2011 |
| JP | 2011-93505 A | 5/2011 |
| KR | 20-1995-0017769 U | 7/1995 |
| KR | 10-0982212 B1 | 9/2010 |
| WO | WO 2007/121382 A2 | 10/2007 |
| WO | WO 2013/028092 A1 | 2/2013 |
| WO | WO 2013/164648 A1 | 11/2013 |

OTHER PUBLICATIONS

International Search Report for PCT/KR2015/006848 (PCT/ISA/210) dated Sep. 7, 2015.

* cited by examiner

AUXILIARY GENERATOR FOR VEHICLE THAT GENERATES ELECTRIC POWER USING INERTIAL FORCE

CROSS-REFERENCE TO RELATED APPLICATIONS

This application is the National Phase of PCT International Application No. PCT/KR2015/006848, filed on Jul. 3, 2015, which claims priority under 35 U.S.C. 119(a) to Patent Application No. 10-2014-0117448, filed in Republic of Korea on Sep. 4, 2014, all of which are hereby expressly incorporated by reference into the present application.

TECHNICAL FIELD

The present invention relates to an auxiliary generator for a vehicle that generates electric power using inertial force.

BACKGROUND ART

A hybrid electric vehicle (HEV) is a vehicle that uses an internal combustion engine and a motor, which is driven by a battery, as a power source. The hybrid electric vehicle has attracted considerable attention as a next-generation transport means developed in consideration of exhaustion of fossil fuels.

The hybrid electric vehicle runs at a high speed using the internal combustion engine and runs at a low speed using the motor, which is driven by the battery.

An electric vehicle, which is configured to run only using a battery and an electric motor without using an internal combustion engine, has also attracted considerable attention. The electric vehicle runs by driving the electric motor using electricity stored in the battery. The electric vehicle has advantages in that the structure of the electric vehicle is simple, the durability of the electric vehicle is high, the driving and maintenance of the electric vehicle are easy, and the electric vehicle does not discharge any pollutants, thereby contributing to the protection of environment. For these reasons, the electric vehicle has been widely developed.

The hybrid electric vehicle and the electric vehicle are expected to be increasingly used in that the hybrid electric vehicle and the electric vehicle incur lower operation expenses and maintenance expenses than conventional vehicles using fossil fuels.

However, the battery used in the hybrid electric vehicle or the electric vehicle provides a shorter driving distance than the internal combustion engine due to limitations of its electric capacity. For this reason, it is necessary to provide a battery charging system such that the battery can be continuously charged.

To this end, the hybrid electric vehicle and the electric vehicle use a system for charging the battery through an energy recuperation system based on marginal driving force or braking during high-speed driving. However, the increase in driving distance that can be realized using only such an energy recuperation system is limited.

Consequently, there is a high necessity for technology that is capable of continuously charging a battery of a hybrid electric vehicle or an electric vehicle, thereby increasing the driving distance of the vehicle.

DISCLOSURE

Technical Problem

Therefore, the present invention has been made to solve the above problems and other technical problems that have yet to be resolved.

As a result of a variety of extensive and intensive studies and experiments to solve the problems as described above, the inventors of the present application have found that, when an auxiliary generator that converts kinetic energy of a vehicle into electrical energy is used, it is possible to continuously charge a battery, thereby increasing the driving distance of a vehicle. The present invention has been completed based on these findings.

Technical Solution

In accordance with one aspect of the present invention, the above and other objects can be accomplished by the provision of an auxiliary generator for a vehicle that converts kinetic energy of the vehicle into electrical energy, the auxiliary generator including a spherical inertial body configured to be movable in a direction opposite to a direction in which the vehicle moves due to inertial force obtained from movement of the vehicle, a fixed pipe having the movable spherical inertial body received therein, a generation member mounted in the fixed pipe for generating electrical energy from movement of the spherical inertial body, and a converter electrically connected to the generation member for converting the electrical energy generated by the generation member into available electricity.

That is, the auxiliary generator according to the present invention is capable of converting kinetic energy obtained from movement of the vehicle into electrical energy through a special structure as described above. Consequently, it is possible to obtain electrical energy simultaneously with movement of the vehicle. As a result, it is possible to continuously charge a battery, thereby increasing the driving distance of the vehicle.

In a non-limiting example of the generation member, the generation member may be a piezoelectric element. The piezoelectric element may be piezoelectric ceramic with sintered lead zirconate titanate (PZT) or barium titanate. However, the present invention is not limited thereto.

The piezoelectric element may be mounted over the inside of the fixed pipe for generating the electrical energy when the spherical inertial body directly applies pressure to the piezoelectric element while moving due to the inertial force.

In this structure, the piezoelectric element may be electrically connected to the converter. The spherical inertial body may provide pressure to the piezoelectric element while moving along the fixed pipe, and the piezoelectric element may generate the electrical energy. The generated electrical energy, i.e. electricity, is transmitted to the converter, which converts the received electricity into available electricity. Battery cells of the vehicle may be charged with the converted electricity, or the converted electricity may be used as power for a motor.

In addition to the spherical inertial body providing pressure while moving along the fixed pipe, pressure may be provided to other positions. For example, the vehicle may be vibrated by external force during movement of the vehicle. At this time, the spherical inertial body may move in the fixed pipe in response to vibration of the vehicle and provide pressure to various positions of the piezoelectric element mounted to the inside of the fixed pipe.

Consequently, the spherical inertial body may have a size less than the inner diameter of the fixed pipe such that the spherical inertial body can variously move in the fixed pipe. For example, the spherical inertial body may have a size equivalent to 50% to 80% of the inner diameter of the fixed pipe.

If the size of the spherical inertial body is less than the above-defined range, the spherical inertial body may not provide sufficient pressure to the piezoelectric element, which is not desirable. On the other hand, if the size of the spherical inertial body is greater than the above-defined range, the movement speed of the spherical inertial body may be lowered due to friction between the spherical inertial body and the piezoelectric element with the result that the amount of electrical energy that is generated by the piezoelectric element may be reduced.

In another non-limiting example of the generation member, the generation member may be a generation bearing mounted in the fixed pipe, the generation bearing including a spherical generation body configured to perform rotational motion according to movement of the spherical inertial body, the generation bearing being configured to generate frictional electricity using frictional force generated by the rotational motion of the spherical generation body.

Specifically, the generation bearing may further include a pair of ring-shaped fixed parts, and the spherical generation body may include two or more spherical generation bodies mounted between the fixed parts.

Two or more rotary shafts may be provided between the fixed parts, and the spherical generation bodies may be mounted to the respective rotary shafts such that the spherical generation bodies rotate about the respective rotary shafts.

Each spherical generation body may be formed in the shape of a sphere such that the spherical generation body can perform rotational motion. The spherical generation body may be made of a nonconductor, such as plastic, such that the spherical generation body can generate frictional electricity through friction between the spherical generation body and the rotary shaft. The rotary shaft may also be made of plastic, which may easily generate frictional electricity.

The frictional electricity generated by rotation of the spherical generation body is collected by the generation bearing via the rotary shaft. The collected frictional electricity is transmitted to the converter, which is electrically connected to the generation bearing. The converter may convert the frictional electricity into available electricity. To this end, the generation bearing may be made of a metal material exhibiting high electric conductivity. Specifically, the generation bearing may be made of a conductive material, such as aluminum or copper. However, the present invention is not limited thereto.

The rotational motion of the spherical generation body may be achieved by movement of the spherical inertial body. That is, when moving in the fixed pipe, the spherical inertial body contacts the spherical generation body of the generation bearing mounted in the fixed pipe, and the spherical generation body obtains rotational force in a direction opposite to a direction in which the spherical inertial body moves. As a result, the spherical generation body rotates. That is, the movement speed of the spherical inertial body decides the rotational force of the spherical generation body.

Consequently, the spherical inertial body may have a sufficient size for the spherical inertial body to pass through the generation bearing in a state in which the movement speed of the spherical inertial body is not lowered. For example, the spherical inertial body may have a size equivalent to 50% to 80% the inner diameter of the generation bearing.

If the size of the spherical inertial body is less than the above-defined range, the spherical inertial body may easily pass through the generation bearing. However, a possibility of the spherical inertial body contacting the spherical generation body is reduced with the result that it is difficult to induce rotational motion of the spherical generation body, which is not desirable. On the other hand, if the size of the spherical inertial body is greater than the above-defined range, the spherical inertial body may not easily pass through the generation bearing. Consequently, the movement speed of the spherical inertial body may be lowered with the result that rotational force of the spherical generation body is reduced, which is not desirable.

In addition, in order to obtain high inertial force, the spherical inertial body may be made of a high-density metal. Specifically, the spherical inertial body may be made of tungsten or platinum. However, the present invention is not limited thereto.

Meanwhile, in a concrete example, the fixed pipe may be configured to have a structure in which two or more pipes extending in different directions are coupled to each other.

Specifically, the fixed pipe may include a first pipe extending in parallel to a lateral direction of the vehicle, a second pipe extending in parallel to a longitudinal direction of the vehicle, and a third pipe extending in parallel to a height direction of the vehicle.

The first pipe, the second pipe, and the third pipe may be coupled to each other while being perpendicular to each other. The structure in which first pipe, the second pipe, and the third pipe are coupled to each other may be flexibly changed based on the internal structure of the vehicle.

In addition, the first pipe, the second pipe, and the third pipe may each have a spherical inertial body received therein.

The first pipe, the second pipe, and the third pipe may each have two or more generation bearings mounted therein. Alternatively, the piezoelectric element may be mounted over the inside of each of the first, second, and third pipes.

In the above structure, the spherical inertial bodies in the first pipe, the second pipe, and the third pipe may obtain inertial force in various directions. Consequently, it is possible to generate electrical energy using kinetic energy obtained from various movements of the vehicle.

For example, when the vehicle moves to the left or to the right, the spherical inertial body received in the first pipe, which extends in parallel to the lateral direction of the vehicle, may move in the first pipe in a direction opposite to a direction in which the vehicle moves. Consequently, it is possible to convert kinetic energy obtained from the movement of the vehicle to the left or to the right into electrical energy.

Meanwhile, when the vehicle is braked, the spherical inertial body received in the second pipe, which extends in parallel to the longitudinal direction of the vehicle, may move in a forward direction of the vehicle, and, when the vehicle is accelerated, the spherical inertial body received in the second pipe may move in a backward direction of the vehicle. Consequently, it is possible to convert kinetic energy obtained from the forward or backward movement of the vehicle into electrical energy.

Furthermore, when the vehicle moves upward or downward due to vibration, the spherical inertial body received in the third pipe, which extends in parallel to the height direction of the vehicle, may move in the third pipe in a direction opposite to a direction in which the vehicle moves. Consequently, it is possible to convert kinetic energy obtained from the vibration of the vehicle into electrical energy.

Alternatively, both the piezoelectric element and the generation bearing may be mounted in each of the first, second, and third pipes.

In the above structure, kinetic energy of the spherical inertial body obtained from various movements of the vehicle may apply pressure to the piezoelectric element to provide rotational force to the spherical generation body of the generation bearing, whereby it is possible to effectively generate electrical energy.

As previously described, therefore, in the auxiliary generator according to the present invention, the spherical inertial body received in the pipe may move due to inertial force naturally generated simultaneously with movement of the vehicle, and the spherical inertial body may provide external force, from which electrical energy can be produced, to the piezoelectric element and/or the generation bearing, whereby it is possible to convert kinetic energy of the vehicle into electrical energy. In addition, the auxiliary generator according to the present invention has a structural characteristic in that fixed pipes are arranged in different directions to convert various kinetic energies obtained from upward, downward, leftward, rightward, forward, and backward movements of the vehicle into electrical energy.

In a concrete example, the fixed pipe may be made of an electrically insulative polymer material or a composite material. Specifically, the fixed pipe may be made of a low-weight composite material. For example, the composite material may be a carbon fiber composite material or a glass fiber composite material. However, the present invention is not limited thereto.

In accordance with another aspect of the present invention, there is provided a vehicle including the auxiliary generator with the above-stated construction and two or more battery cells chargeable with electric power generated by the auxiliary generator.

Each of the battery cells may be a pouch-shaped secondary battery including an electrode assembly, which is configured to have a structure in which a separator is disposed between a positive electrode and a negative electrode, mounted in a battery case made of a laminate sheet including a metal layer and a resin layer in a sealed state. Alternatively, each of the battery cells may be a lithium secondary battery.

The two or more battery cells may be stacked in a specific structure to constitute a large-capacity battery module.

The vehicle may be any one selected from a group consisting of an electric vehicle, a hybrid electric vehicle, and a plug-in hybrid electric vehicle. However, the present invention is not limited thereto.

BRIEF DESCRIPTION OF DRAWINGS

The above and other objects, features and other advantages of the present invention will be more clearly understood from the following detailed description taken in conjunction with the accompanying drawings, in which.

BEST MODE

Now, exemplary embodiments of the present invention will be described in detail with reference to the accompanying drawings. It should be noted, however, that the scope of the present invention is not limited by the illustrated embodiments.

Figure 1:
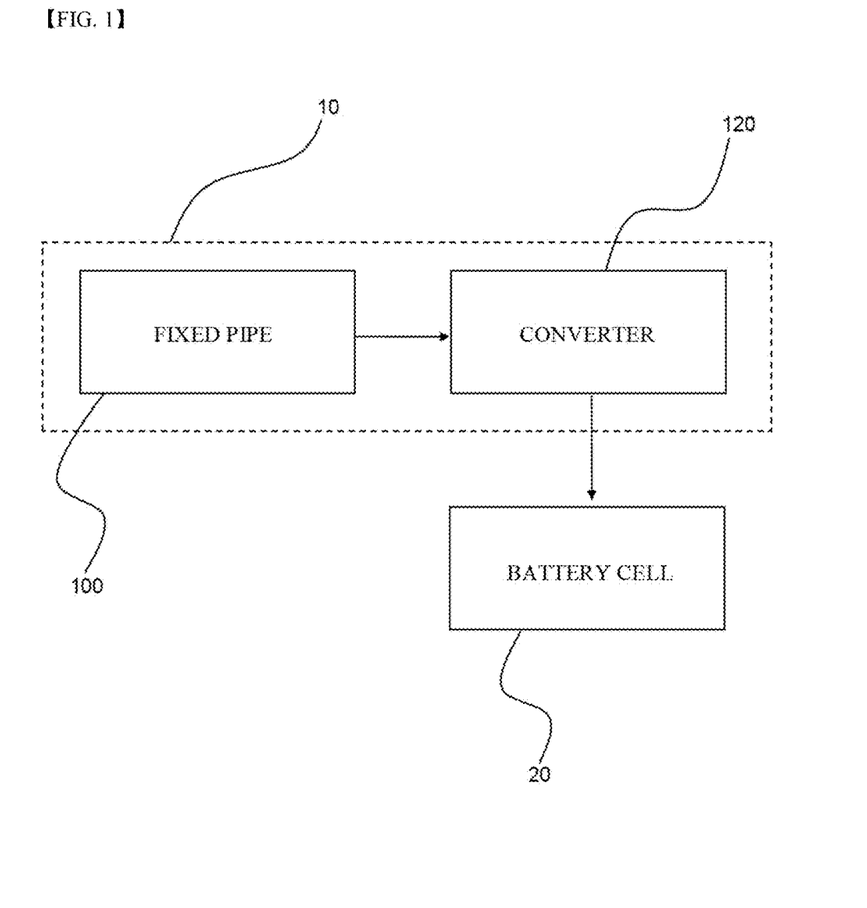
FIG. 1 is a typical view showing an auxiliary generator according to the present invention.
Figure 2:
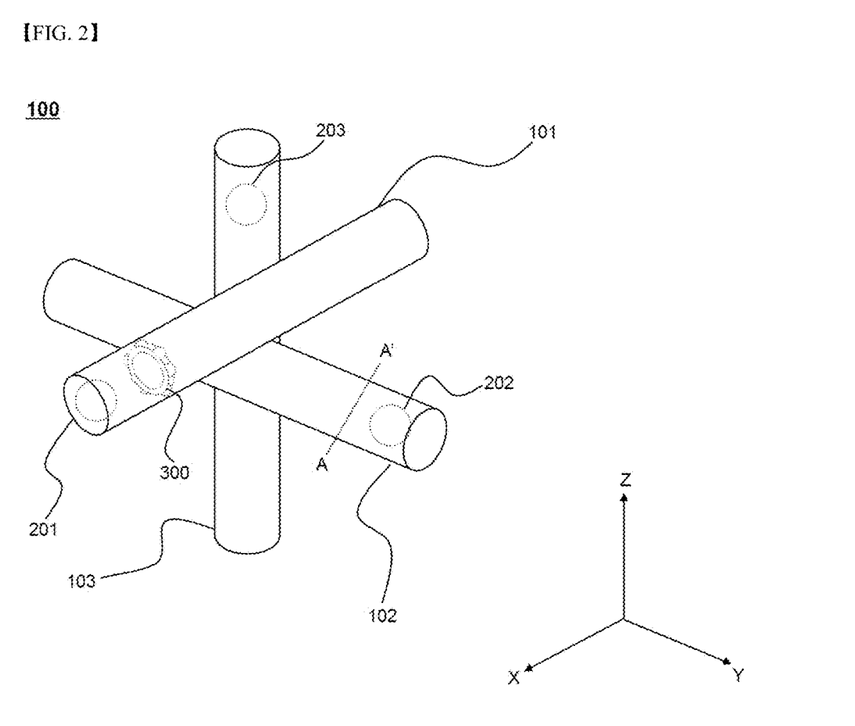
FIG. 2 is a typical view showing a fixed pipe of FIG. 1 in detail.
Figure 3:
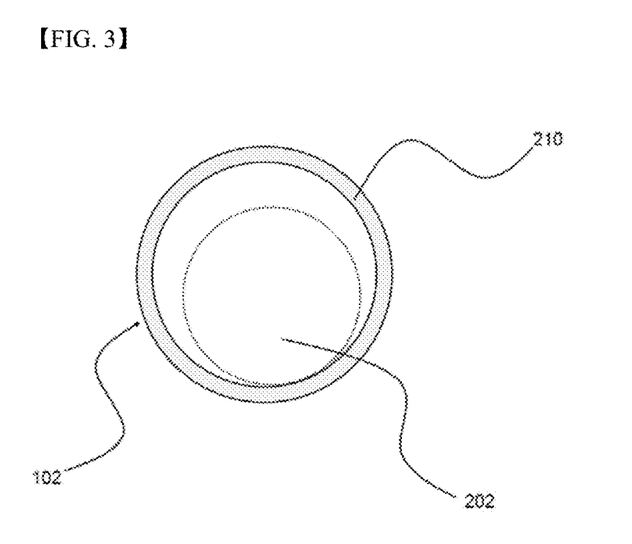
FIG. 3 is a vertical sectional view of the fixed pipe taken along line A-A' of FIG. 2.
Figure 4:
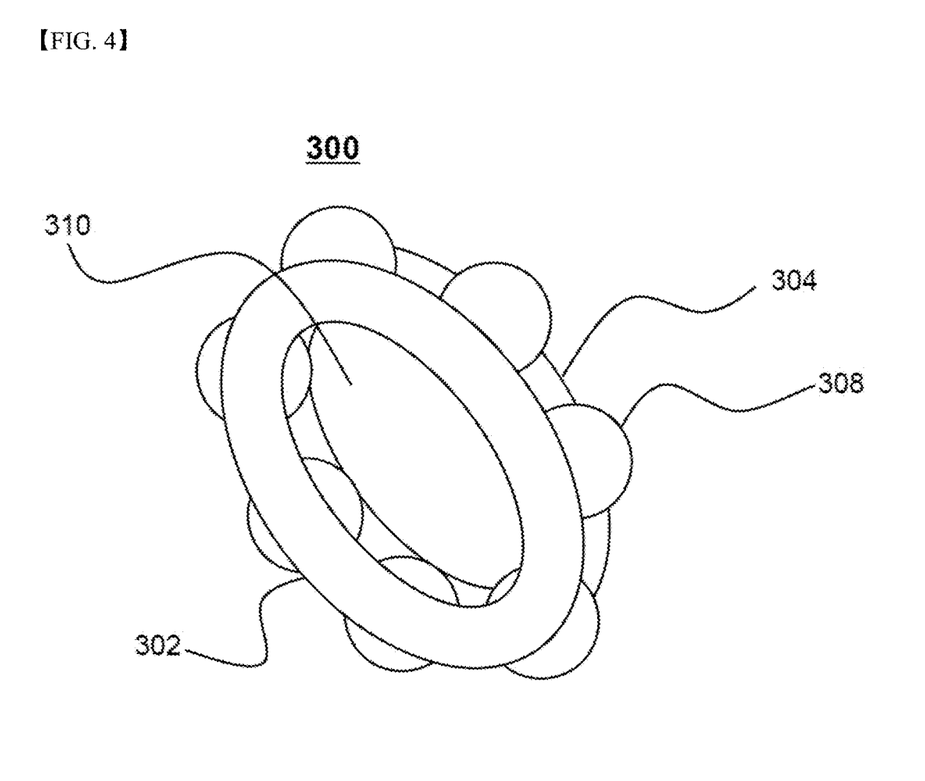
FIG. 4 is a typical view showing a generation bearing of FIG. 2 in detail.
Figure 5:
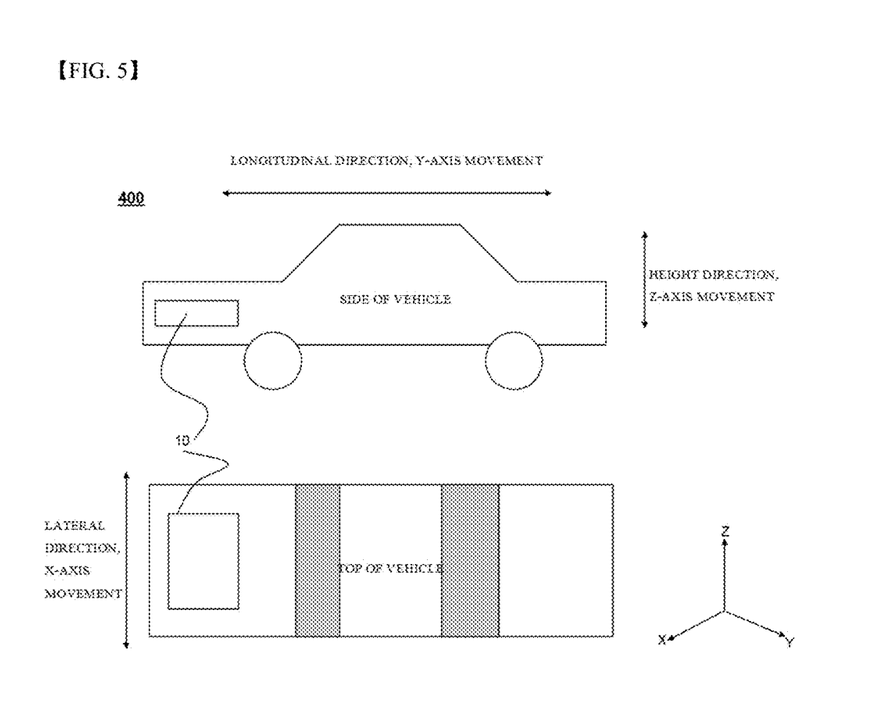
FIG. 5 is a typical view showing a vehicle equipped with the auxiliary generator according to the present invention.

FIG. 1 is a typical view showing an auxiliary generator according to the present invention, FIG. 2 is a typical view showing a fixed pipe of FIG. 1 in detail, FIG. 3 is a vertical sectional view of the fixed pipe taken along line A-A' of FIG. 2, FIG. 4 is a typical view showing a generation bearing of FIG. 2 in detail, and FIG. 5 is a typical view showing a vehicle equipped with the auxiliary generator according to the present invention.

Referring first to FIGS. 1 to 3, an auxiliary generator 10 includes a fixed pipe 100, a piezoelectric element 210 mounted at the inside of the fixed pipe 100, a generation bearing 300 mounted in the fixed pipe 100, spherical inertial bodies 201, 202, and 203 configured to be movable in the fixed pipe 100, and a converter 120 for converting frictional electricity from the piezoelectric element 210 and the generation bearing 300 into electricity.

As shown in FIG. 1, electricity, generated by the piezoelectric element 210 and the generation bearing 300 according to movement of the spherical inertial bodies 201, 202, and 203 in the fixed pipe 100, is transmitted to the converter 120 electrically connected thereto. The converter 120 converts the received electricity into electric current, with which a battery cell 20 may be charged. The battery cell 20 is charged with the electric current at a uniform voltage.

Referring to FIGS. 2 to 5, the fixed pipe 100 includes a first pipe 101, a second pipe 102, and a third pipe 103, which extend in different directions.

Specifically, the first pipe 101 extends in an X-axis direction, which is parallel to a lateral direction of a vehicle 400, such that the first pipe 101 is perpendicular to the second pipe 102 and the third pipe 103. The second pipe 102 extends in a Y-axis direction, which is parallel to a longitudinal direction of the vehicle 400, such that the second pipe 102 is perpendicular to the first pipe 101 and the third pipe 103. The third pipe 103 extends in a Z-axis direction, which is parallel to a height direction of the vehicle 400, such that the third pipe 103 is perpendicular to the first pipe 101 and the second pipe 102.

For the convenience of description, the generation bearing 300 is shown as being mounted in the first pipe in FIG. 2, and the piezoelectric element 210 is shown as being mounted at the inside of the second pipe in FIG. 3, which is illustrative. Two or more generation bearings 300 may be mounted in each of the first to third pipes 101 to 103, and one piezoelectric element 210 may be mounted over the inside of each of the first to third pipes 101 to 103. In addition, the generation bearings 300 and the piezoelectric elements 210 may be flexibly arranged in consideration of the length of each of the pipes and a desirable amount of electrical energy.

A piezoelectric element (not shown) and a generation bearing 300 are mounted in the first pipe 101, and a spherical inertial body 201 is received in the first pipe 101 such that the spherical inertial body 201 moves along the first pipe 101 in the X-axis direction. A piezoelectric element 210 and a generation bearing (not shown) are mounted in the second pipe 102, and a spherical inertial body 202 is received in the second pipe 102 such that the spherical inertial body 202 moves along the second pipe 102 in the Y-axis direction. A piezoelectric element (not shown) and a generation bearing (not shown) are mounted in the third pipe 103, and a spherical inertial body 203 is received in the third pipe 103 such that the spherical inertial body 203 moves along the third pipe 103 in the Z-axis direction.

The generation bearing 300 is configured to have a structure in which a plurality of spherical generation bodies 308 are mounted to rotary shafts (not shown) between a pair of ring-shaped fixed parts 302 and 304. The ring-shaped generation bearing 300 has an opening 310, though which the spherical inertial body 201 passes. The spherical generation bodies 308 partially protrude into the opening 310. When the spherical inertial body 201 passes through the opening 310 of the generation bearing 300, therefore, the spherical generation bodies 308, which partially protrude into the opening 310, contact the spherical inertial body 201 with the result that the spherical generation bodies 308 rotates in a direction opposite to a direction in which the spherical inertial body 201 moves. As the spherical generation bodies 308 rotates about the respective rotary shafts, the spherical generation bodies 308 generate frictional electricity.

Meanwhile, the auxiliary generator 10 is mounted in the vehicle 400 shown in FIG. 5. When the vehicle 400 moves in the lateral direction of the vehicle 400, i.e. the X-axis direction (to the left or to the right), the spherical inertial body 201 received in the first pipe 101 obtains inertial force in a direction opposite to the direction in which the vehicle 400 moves and thus moves in the first pipe 101. At this time, the spherical inertial body 201 presses the piezoelectric element in an advancing direction thereof. As a result, pressure applied to the piezoelectric element is instantaneously changed, and therefore the piezoelectric element generates electricity. In addition, the spherical inertial body 201 rotates the spherical generation bodies 308 of the generation bearing 300, and rotational motion of the spherical generation bodies 308 is converted into electrical energy.

When the vehicle 400 is accelerated or decelerated in the longitudinal direction of the vehicle 400, i.e. the Y-axis direction, the spherical inertial body 202, which is received in the second pipe 102, obtains inertial force in a direction opposite to the direction in which the vehicle 400 is accelerated or decelerated and thus moves in the second pipe 102. At this time, the spherical inertial body 202 presses the piezoelectric element in an advancing direction thereof. As a result, pressure applied to the piezoelectric element is instantaneously changed, and therefore the piezoelectric element generates electricity. In addition, the spherical inertial body 202 rotates the spherical generation bodies (not shown) of the generation bearing (not shown), and rotational motion of the spherical generation bodies (not shown) is converted into electrical energy.

When the vehicle 400 moves upward in the height direction of the vehicle 400, i.e. the Z-axis direction, the spherical inertial body 203, which is received in the third pipe 103, obtains downward inertial force and thus moves in the third pipe 103. When the vehicle 400 moves downward in the Z-axis direction, the spherical inertial body 203 obtains upward inertial force and thus moves in the third pipe 103. The spherical inertial body 203 provides pressure and rotational force to the piezoelectric element and the generation bearing to generate electricity. When the vehicle 400 moves upward and downward, the spherical inertial bodies 201 and 202, which are received in the first pipe 101 and the second pipe 102, shake downward and upward in the first pipe 101 and the second pipe 102 in response to the upward and downward movement of the vehicle 400 to apply pressure to the piezoelectric elements 210. As a result, the piezoelectric elements 210 generate electricity.

As described above with reference to the drawings, the auxiliary generator according to the present invention has structural features in that the spherical inertial bodies received in the fixed pipe are moved by kinetic energy generated according to movement of the vehicle, and electrical energy is generated from movement of the spherical inertial bodies through the piezoelectric elements and the generation bearings, whereby it is possible to obtain electrical energy simultaneously with movement of the vehicle. Consequently, the auxiliary generator according to the present invention may increase the distance that the vehicle can be driven using electricity.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, an auxiliary generator according to the present invention is capable of converting kinetic energy obtained from movement of a vehicle into electrical energy through a special structure as described above. Consequently, it is possible to obtain electrical energy simultaneously with movement of the vehicle. As a result, it is possible to continuously charge a battery, thereby increasing the driving distance of a vehicle.

The invention claimed is:

1. An auxiliary generator for a vehicle that converts kinetic energy of the vehicle into electrical energy, the auxiliary generator comprising:
    a spherical inertial body configured to be movable in a direction opposite to a direction in which the vehicle moves due to inertial force obtained from movement of the vehicle;
    a fixed pipe having the movable spherical inertial body received therein;
    a generation member mounted in the fixed pipe for generating electrical energy from movement of the spherical inertial body; and
    a converter electrically connected to the generation member for converting the electrical energy generated by the generation member into available electricity,
    wherein the generation member is a generation bearing mounted in the fixed pipe, the generation bearing comprising a spherical generation body configured to perform rotational motion according to movement of the spherical inertial body, the generation bearing being configured to generate frictional electricity using frictional force generated by the rotational motion of the spherical generation body.

2. The auxiliary generator according to claim 1, wherein the generation member is a piezoelectric element.

3. The auxiliary generator according to claim 2, wherein the piezoelectric element is mounted over an inside of the fixed pipe for generating the electrical energy when the spherical inertial body directly applies pressure to the piezoelectric element while moving due to the inertial force.

4. The auxiliary generator according to claim 1, wherein the generation bearing further comprises a pair of ring-shaped fixed parts, and the spherical generation body comprises two or more spherical generation bodies mounted between the fixed parts.

5. The auxiliary generator according to claim 4, wherein two or more rotary shafts are provided between the fixed parts, and the spherical generation bodies are mounted to the respective rotary shafts such that the spherical generation bodies rotate about the respective rotary shafts.

6. The auxiliary generator according to claim 1, wherein, when moving in the fixed pipe, the spherical inertial body contacts the spherical generation body of the generation bearing mounted in the fixed pipe, and the spherical generation body obtains rotational force in a direction opposite to a direction in which the spherical inertial body moves.

7. The auxiliary generator according to claim 1, wherein the fixed pipe is configured to have a structure in which two or more pipes extending in different directions are coupled to each other.

8. The auxiliary generator according to claim 7, wherein the fixed pipe comprises a first pipe extending in parallel to a lateral direction of the vehicle, a second pipe extending in parallel to a longitudinal direction of the vehicle, and a third pipe extending in parallel to a height direction of the vehicle.

9. The auxiliary generator according to claim 8, wherein the first pipe, the second pipe, and the third pipe each have a spherical inertial body received therein.

10. The auxiliary generator according to claim 9, wherein, when the vehicle moves to a left or to a right, the spherical inertial body received in the first pipe moves in the first pipe in a direction opposite to a direction in which the vehicle moves.

11. The auxiliary generator according to claim 9, wherein, when the vehicle is braked, the spherical inertial body received in the second pipe moves in a forward direction of the vehicle, and, when the vehicle is accelerated, the spherical inertial body received in the second pipe moves in a backward direction of the vehicle.

12. The auxiliary generator according to claim 9, wherein, when the vehicle moves upward or downward due to vibration, the spherical inertial body received in the third pipe moves in the third pipe in a direction opposite to a direction in which the vehicle moves.

13. The auxiliary generator according to claim 8, wherein the first pipe, the second pipe, and the third pipe each have two or more generation bearings and/or a piezoelectric element mounted therein.

14. The auxiliary generator according to claim 1, wherein the spherical inertial body has a diameter equivalent to 50% to 80% of an inner diameter of the fixed pipe.

15. The auxiliary generator according to claim 1, wherein the fixed pipe is made of an electrically insulative polymer material or a composite material.

16. The auxiliary generator according to claim 15, wherein the composite material is a carbon fiber composite material or a glass fiber composite material.

17. The auxiliary generator according to claim 1, wherein the spherical inertial body is made of tungsten or platinum.

18. A vehicle comprising an auxiliary generator according to claim 1 and two or more battery cells chargeable with electric power generated by the auxiliary generator.

19. The vehicle according to claim 15, wherein the vehicle is any one selected from a group consisting of an electric vehicle, a hybrid electric vehicle, and a plug-in hybrid electric vehicle.

* * * * *